United States Patent
Kim et al.

(10) Patent No.: US 6,551,913 B1
(45) Date of Patent: Apr. 22, 2003

(54) METHOD FOR FABRICATING A GATE ELECTRODE OF A SEMICONDUCTOR DEVICE

(75) Inventors: Hyeon Soo Kim, Ichon-shi (KR); Chang Seo Park, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/343,480

(22) Filed: Jun. 30, 1999

(30) Foreign Application Priority Data

Jun. 30, 1998 (KR) .............................. 98-25271

(51) Int. Cl.[7] .................. H01L 21/3205; H01L 21/4763
(52) U.S. Cl. .................. 438/592; 438/618; 438/652; 438/655; 438/669
(58) Field of Search ...................... 438/592, 585, 438/593, 618, 622, 669, 655, 652, 624, 197, 211; 458/595, 663, 664, 275, 279

(56) References Cited

U.S. PATENT DOCUMENTS

| | | | |
|---|---|---|---|
| 4,505,027 A | | 3/1985 | Schwabe et al. |
| 5,334,545 A | * | 8/1994 | Caviglia ..................... 438/592 |
| 5,538,917 A | | 7/1996 | Kunitou |
| 5,545,578 A | * | 8/1996 | Park t al. ..................... 438/303 |
| 5,559,049 A | * | 9/1996 | Cho ............................ 438/304 |
| 5,661,052 A | | 8/1997 | Inoue et al. |
| 5,796,151 A | * | 8/1998 | Hsu et al. ..................... 257/410 |
| 6,002,150 A | * | 12/1999 | Gardner et al. ............. 257/310 |
| 6,124,619 A | * | 9/2000 | Maeda et al. ................ 257/411 |
| 6,218,311 B1 | * | 4/2001 | McKee et al. ............... 438/719 |
| 6,228,717 B1 | * | 5/2001 | Hazama et al. ............. 438/265 |

FOREIGN PATENT DOCUMENTS

| | | |
|---|---|---|
| JP | 60-127761 | 7/1985 |
| JP | 63-299280 | 12/1988 |
| JP | 3-209775 | 9/1991 |
| JP | 3-280550 | 12/1991 |

* cited by examiner

*Primary Examiner*—Amir Zarabian
*Assistant Examiner*—Maria Guerrero
(74) *Attorney, Agent, or Firm*—Jacobson Holman PLLC

(57) ABSTRACT

The present invention relates to a semiconductor technology and more specifically to a method of fabricating a gate electrode of a semiconductor device, where a re-oxidation process that may cause an abnormal oxidation can be eliminated. In a polysilicon/silicide structure or polysilicon/metal structure of gate electrode, a step of etching side parts of gate electrode is performed without any etch mask after gate patterning. Here, the etch can be made by wet or dry etch using an etchant having high selectivity of polysilicon film to a gate oxide film, so that the damaged gate oxide part during the gate patterning is allowed not to make a role of the gate insulating film itself, thereby eliminating the re-oxidation process.

15 Claims, 1 Drawing Sheet

METHOD FOR FABRICATING A GATE ELECTRODE OF A SEMICONDUCTOR DEVICE

BACKGROUND OF THE INVENTION

The present invention relates to a semiconductor fabrication technology, and more specifically to a method of fabricating a gate electrode of a semiconductor device.

Generally, the gate electrodes of MOS transistors are composed of a polysilicon layer.

As the integration density of a semiconductor device is higher, the patterns of the semiconductor device including gate electrodes is reduced in sizes, and more specifically the pattern widths thereof are shrunk to 0.25 $\mu$m. Accordingly, the doped polysilicon film typically used as a gate electrode has a high resistivity and thus the time delay caused by the gate electrode become longer. Thus, it is difficult that the doped polysilicon film is used in a high speed device. The higher the integration of semiconductor device is, the more serious such difficulty becomes.

A conventional technology to solve such a problem is that a polycide structure primarily composed of a tungsten silicide film is used as gate electrode. A polysilicon/metal structure is also paid attention to for the usage of gate electrode.

However, such polycide or polysilicon/metal structures have a problem in that the re-oxidation process performed for recovering the etch damage in a gate oxide and a substrate due to gate patterning is not easily implemented.

This is because an abnormal oxidation is made in the silicide film or metal film when they are exposed in oxidation process. The difficulty in re-oxidation process after gate patterning may prevent the polycide or polysilicon/metal structure from being used as gate electrode.

SUMMARY OF THE INVENTION

Accordingly, the object of the present invention is to provide a method for fabricating a gate electrode of a semiconductor device, which is capable of omitting such a re-oxidation process that may cause an abnormal oxidation.

To achieve the above object of the present invention, there is provided a method for fabricating a gate electrode in a semiconductor device, comprising the steps of: sequentially forming a gate insulating film, a polysilicon film and a metal element containing film on a semiconductor substrate; patterning the metal element containing film and the polysilicon film by selectively etching; and etching side parts of the patterned polysilicon film so that the polysilicon film does not exist on the damaged gate insulating film.

In preferred embodiments, the metal element containing film can be a silicide film or a metal film. The etching step of side parts of the patterned polysilicon film is performed by wet etching using an etchant mixed a substantially 0.5 wt %~29 wt %, preferably 29 wt % of NH$_4$OH·H$_2$O solution with a pure water in the ratio of 1:2~1:50, preferably 1:20, where this etching may be preferably performed at 65° C.~80° C.

The step of etching side parts of the patterned polysilicon film may be performed by wet etching using 0.5 wt %~10 wt %, preferably 2.35 wt % of TMAH(tetra-methyl-ammonium-hydroxide) solution at 65° C.~70° C.

According to another embodiment of the present invention, the step of etching side parts of the patterned polysilicon film is performed by dry etching using a mixed gas of 3~5 lpm ozone (O$_3$) gas and 150~200 sccm HF gas at room temperature and atmosphere pressure.

The present invention also provide a method for fabricating a gate electrode of a semiconductor device, comprising the steps of: forming a gate oxide film on a semiconductor substrate; forming a polysilicon film on the gate oxide film; forming a silicide film on the polysilicon film; forming a photoresist pattern for gate electrode formation on the silicide film; etching the silicide film and the polysilicon film using the photoresist pattern as etch mask, so as to form a gate electrode; and etching sides of the gate electrode. Here, the silicide film is composed of at least one of WSi$_x$, TiSi$_x$, CoSi$_x$, MoSi$_x$.

In summary, the present invention omits a re-oxidation process by patterning a gate electrode and then performing a wet and dry etching process having a high selectivity of polysilicon film to an oxide film without separate etch mask pattern, in the gate electrode formation: of polysilicon/silicide structure or polysilicon/metal structure.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE PRESENT INVENTION

The preferred embodiment of the present invention will hereinafter be described in detail with reference to the accompanying drawings.

Figure 1A:
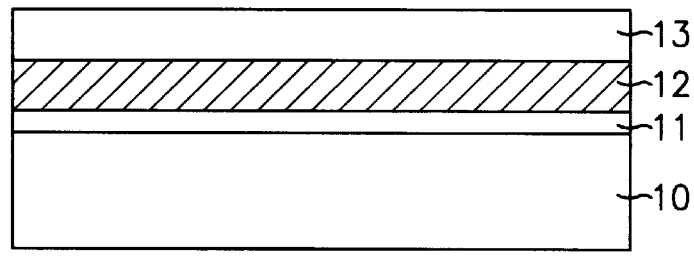
FIGS. 1A to 1C are cross sectional views of illustrating the fabrication steps of a gate formation, in accordance with one preferred embodiment of the present invention.
Figure 1B:
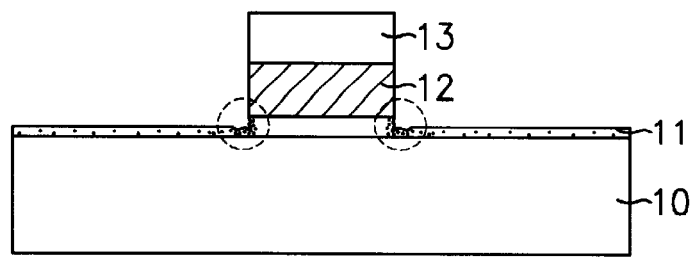
Figure 1C:
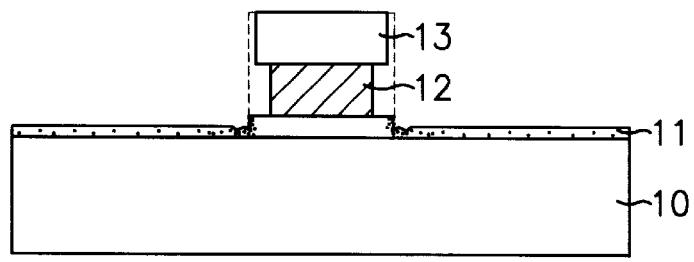

FIGS. 1A to 1C are cross sectional views of illustrating the fabrication steps of a gate formation, in accordance with one preferred embodiment of the present invention.

Referring to FIG. 1A, a gate oxide film 11, a gate poly silicon film 12 and a tungsten silicide film 13 are sequentially deposited on a silicon substrate 10 where field oxides (not shown) have been formed.

Next, as shown in FIG. 1B, a photoresist pattern 14 (not shown) for gate electrode patterning is formed on the tungsten silicide film 13 and then the tungsten silicide film 13 and the gate poly silicon film 12 are sequentially dry-etched using the photoresist pattern 14 as etch-preventive mask, so as to form a gate electrode. At this time, the photoresist pattern 14 is wider than a desired width of the gate electrode by the degree to be etched in later processes. The gate oxide film 11 is damaged in the dry etch process. The parts depicted by dotted circles of FIG. 1B, represent the damaged parts of the gate oxide film 11.

Subsequently, the photoresist pattern 14 is removed as shown in FIG. 1C, and then the gate electrode, especially the side parts of the gate polysilicon film 12 is etched. Here, this etching may be implemented by a wet etch or dry etch. For wet etch, the etching process of the side parts of the gate polysilicon film 12 can be performed without removing the photoresist pattern 14.

This wet etching may be preferably performed using an etchant composed of 0.5 wt %~29 wt %, preferably 29 wt % of NH$_4$OH solution and pure water mixed in the ratio of 1:2~1:50, preferably 1:20 at 65° C.~80° C. According to another embodiment, this wet etching for sides of polysilicon film 12 may be performed using 0.5 wt %~10 wt %, preferably 2.35 wt % of TMAH(tetra-methyl-ammonium-hydroxide) solution at 65° C.~70° C.

Also, the dry etching for the side parts of the gate polysilicon film 12 may be performed using a mixed gas of 3~5 lpm of ozone ($O_3$) gas and 150~200 sccm of HF gas at the room temperature and atmosphere pressure. When the etching of sides of polysilicon film 12 is performed as above described wet or dry etching, the etch selectivity of polysilicon film to the oxide film is roughly 200:1~400:1, so that the gate oxide film 11 is substantially prevented from being damaged. More specifically, the etch selectivity of polysilicon film to the gate oxide film is roughly 200:1 when using a high temperature $NH_4OH \cdot H_2O$ ($NH_4OH:H_2O=1:20$) at 70° C.~80° C., roughly 400:1 when using 2.35 wt % of TMAH solution at 65° C., and roughly 200:1 when using mixed gas of 3 lpm (=liter per minute) of $O_3$ gas and 150~200 sccm (=standard cubic centimeter per minute:$cm^3$/min) of HF gas.

It is apparent to those skilled in-the art that the present invention can be also adopted in the formation of polysilicon/tungsten structure gate electrode.

In addition, even though the above illustrative example relates to the gate electrode composed of tungsten silicide or tungsten, the present invention can be also applied to the formation of the gate electrode composed of a silicide film (e.g. titanium silicide, cobalt silicide film, molybdenum silicide film or so) or metal film along with polysilicon film.

In accordance with the present invention, a re-oxidation process after gate etch can be omitted and thus an abnormal oxidation can be essentially prevented. Thus, a polysilicon/silicide structure or polysilicon/metal structure of gate electrode can be commercially implemented in a realistic semiconductor device. Also, since the re-oxidation process that is performed in high temperatures is omitted, the deterioration of device characteristics due to thermal process can be prevented accordingly.

Although preferred embodiments of the present invention has been illustrated and described, various alternatives, modifications and equivalents may be used. Therefore, the foregoing description should not be taken as limiting the scope of the present invention which is defined by the appended claims.

What is claimed is:

1. A method for fabricating a gate electrode in a semiconductor device, comprising the steps of:
   sequentially forming a gate insulating film, a polysilicon film and a metal element containing film on a semiconductor substrate;
   patterning the metal element containing film and the polysilicon film by selectively etching, said patterning step damaging a portion of the gate insulating film nearby an interface between the insulating film and the polysilicon film; and
   etching side parts of the patterned polysilicon film to allow the polysilicon film exist on a non-damaged portion of the gate insulating film, thereby forming a T-shaped gate structure with the metal element containing film and the etched polysilicon film.

2. The method in accordance with the claim 1, wherein said metal element containing film is a silicide film or a metal film.

3. The method in accordance with the claim 1, wherein the step of etching side parts of the patterned polysilicon film is performed by wet etching using $NH_4OH \cdot H_2O$ solution.

4. The method in accordance with the claim 2, wherein the step of etching side parts of the patterned polysilicon film is performed by wet etching using $NH_4OH \cdot H_2O$ solution.

5. The method in accordance with the claim 4, wherein the step of etching side parts of the patterned polysilicon film is performed by wet etching using an etchant mixed 0.5 wt %~29 wt % of $NH_4OH$ solution with a pure water in the ratio of 1:2~1:50.

6. The method in accordance with the claim 5, wherein the step of etching side parts of the patterned polysilicon film is performed at 65° C.~80° C.

7. The method in accordance with the claim 1, wherein the step of etching side parts of the patterned polysilicon film is performed by wet etching using TMAH (tetra-methyl-ammonium-hydroxide) solution.

8. The method in accordance with the claim 2, wherein the step of etching side parts of the patterned polysilicon film is performed by wet etching using,TMAH (tetra-methyl-ammonium-hydroxide) solution.

9. The method in accordance with the claim 8, wherein the TMAH (tetra-methyl-ammonium-hydroxide) solution is 0.5 wt %~10 wt % in density.

10. The method in accordance with the claim 9, wherein the step of etching side parts of the patterned polysilicon film is performed at 65° C.~70° C.

11. The method in accordance with the claim 1, wherein the step of etching side parts of the patterned polysilicon film is performed by dry etching using a mixed gas of an ozone ($O_3$) gas and a HF gas.

12. The method in accordance with the claim 11, wherein said mixed gas includes 3~5 lpm of ozone gas and 150~200 sccm of HF.

13. The method in accordance with the claim 12, wherein the step of etching side parts of the patterned polysilicon film is performed at room temperature and atmosphere pressure.

14. A method for fabricating a gate electrode for a semiconductor device, comprising the steps of:
   forming a gate oxide film on a semiconductor substrate;
   forming a polysilicon film on the gate oxide film;
   forming a silicide film on the polysilicon film;
   forming a photoresist pattern for gate electrode formation on the silicide film;
   etching the silicide film and the polysilicon film using the photoresist pattern as an etch mask, said etching step damaging a portion of said gate oxide film nearby an interface between the oxide film and the polysilicon film; and
   etching sides of the polysilicon film to allow the polysilicon film exist on a non-damaged portion of the gate oxide film, thereby forming a T-shaped gate structure with the silicide film and the etched polysilicon film.

15. The method in accordance with the claim 14, wherein said silicide film is composed of at least one of $WSi_x$, $TiSi_x$, $CoSi_x$, $MoSi_x$.

* * * * *